United States Patent [19]
Radjy et al.

[11] Patent Number: 5,576,991
[45] Date of Patent: Nov. 19, 1996

[54] MULTISTEPPED THRESHOLD CONVERGENCE FOR A FLASH MEMORY ARRAY

[75] Inventors: Nader Radjy, Palo Alto; Lee E. Cleveland, Santa Clara; Jian Chen, San Jose; Shane C. Hollmer, Santa Clara, all of Calif.

[73] Assignee: Advanced Micro Devices, Inc., Sunnyvale, Calif.

[21] Appl. No.: 269,540

[22] Filed: Jul. 1, 1994

[51] Int. Cl.$^6$ ..................................... G11C 11/40
[52] U.S. Cl. ............... 365/185.24; 365/185.19; 365/185.3
[58] Field of Search ............... 365/184, 185, 365/218, 900, 104, 185.18, 185.19, 185.24, 185.3, 185.33

[56] References Cited

U.S. PATENT DOCUMENTS

| | | | |
|---|---|---|---|
| 5,122,985 | 6/1992 | Santin | 365/185 |
| 5,132,935 | 7/1992 | Ashmore, Jr. | 365/185 |
| 5,295,107 | 3/1994 | Okazawa et al. | 365/185.33 |
| 5,327,385 | 7/1994 | Oyama | 365/185.24 |
| 5,357,476 | 10/1994 | Kuo et al. | 365/218 |

OTHER PUBLICATIONS

J. Chen, N. Radjy, S. Cagnina and J. Lien, "Study of Over Erase Correction Convergence Point Vth*," Advanced Micro Devices Technology Conference, 1994, pp. 68–69.

S. Yamada, T. Suzuki, E. Obi, M. Oshikiri, K. Naruke and M. Wada, "A Self–Convergence Erasing Scheme For A Simple Stacked Gate Flash EEPROM," IEEE *Tech. Dig.* IEDM 1991, pp. 307–310.

*Primary Examiner*—Joseph A. Popek
*Attorney, Agent, or Firm*—Fliesler, Dubb, Meyer & Lovejoy

[57] ABSTRACT

A method of converging threshold voltages of memory cells in a flash EEPROM array after the memory cells have been erased, the method including applying a gate voltage having an initial negative value which is increased to a more positive value in steps during application of a drain disturb voltage. By applying a gate voltage with an initial negative value, leakage current during convergence is reduced enabling all cells on bit lines of the array to be converged in parallel.

16 Claims, 4 Drawing Sheets

MULTISTEPPED THRESHOLD CONVERGENCE FOR A FLASH MEMORY ARRAY

BACKGROUND OF THE INVENTION

1. Field of the Invention

The present invention relates to flash memory arrays, and more particularly to a method for converging the threshold voltage distribution of memory cells in flash memory arrays after erase.

2. Description of the Related Art

A method of converging the threshold voltage distribution of memory cells after erase is typically provided in flash memory arrays by manufacturers. Converging threshold voltages after erase prevents leakage current from over-erased cells from causing read and program errors. To facilitate understanding threshold convergence methods, components of flash memory cells and procedures for programming and erasing the memory cells are first described.

FIG. 1 shows a cross section of a typical flash EEPROM array cell 2. The cell 2 is formed on a substrate 4 having a source 6 and drain 8 provided adjacent to its surface. Separated from the substrate 2 by an oxide layer is a floating gate 10 which is further separated from a control gate 12 by an additional oxide layer.

To program a cell 2, a large positive voltage is typically established between the control gate 12 and drain 8. For instance, a typical control gate voltage $V_G$ may be set to 13 V while a drain voltage $V_D$ is set to 6 V and the source voltage $V_s$ is grounded. The large positive gate-to-drain voltage enables electrons to overcome an energy barrier existing between the substrate 2 and the oxide underlying the floating gate 10 enabling the electrons to be driven from the drain 8 onto the floating gate 10. The electrons stored on the floating gate 10 increase the cell threshold voltage (the gate-to-source voltage required for a cell to turn on or conduct).

To represent a data bit, the floating gate 10 is programmed to store a charge as described above. In a programmed state, the threshold voltage of cells is typically set at greater than 6.5 volts, while the threshold voltage of cells in the erased state is typically limited from 0.5 volts to 3.0 volts. To read a cell, a control gate voltage between the 3.0 and 6.5 volt range, typically 5 V, is applied. With 5 V applied to the gate, in a programmed state with a threshold above 6.5 V, a current will not conduct between the drain and source, but in an erased state with a threshold below 3.0 V a current will conduct.

To erase the cell 2, a large positive voltage from the source to gate is established. For instance, a typical control gate voltage $V_G$ may be set to −10 V while the source voltage $V_S$ is set to +5 V and the drain is floated. The large positive source-to-gate voltage enables electrons to, tunnel from the floating gate 10 reducing the threshold voltage of the cell.

FIG. 2 illustrates how memory cells of FIG. 1 are configured in an array 200. Drains of a column of memory cells are connected to one of bit lines BL0–BL2. Gates of a row of memory cells are connected to one of word lines WL0–WL2. Sources of all memory cells in a block of memory cells are typically connected together to form a source line SL. Power is supplied to the individual word lines, bit lines and source lines by a power supply 202 to control programming, erase and read operations.

In a flash memory array, all cells are typically erased simultaneously. Erasing of the memory cells is typically done by repeated applications of a short, approximately 10 msec, source-to-gate erase voltage, described above, applied to each of the cells over the source and word lines. After each application of the erase voltage, a read or verify gate-to-source voltage is applied to the memory cells of typically 3.2 V to 5.0 V. During verify, current is measured to assure all cells have thresholds below the 3.0 V limit required for an erased cell as described above. If a cell does not conduct current during verify, indicating its threshold is above the 3.0 V limit, additional erase pulses are applied until all cells conduct.

By continuing to apply erase pulses to cells which have been properly erased, a phenomena known as over-erasing occurs. Over-erase occurs because each application of an erase pulse removes electrons from the floating gate of memory cells, including those cells which have been properly erased. When too many electrons are removed, floating gates may become positively charged causing the overerased condition. With a memory cell overerased, its threshold becomes less than zero volts.

One problem caused by overerased cells is read errors. To read a given memory cell in an array such as in FIG. 2, a positive bit line voltage is applied to a selected column of cells and a positive word line voltage is applied to a selected row of cells with unselected word lines grounded. With a memory cell on the selected bit line overerased, having a threshold below zero volts, with its gate voltage grounded to zero volts the cell will conduct causing a false reading.

Another problem caused by overerased cells is leakage current during programming. As with reading, for programming, a positive bit line voltage is applied to a selected column of cells and a positive word line voltage is applied to a selected row of cells with unselected word lines grounded. With an overerased cell on the selected bit line, zero volts on its gate will cause it to conduct leakage current. The leakage current may overload the power supply current available on the selected bit line, especially if a charge pump is required in the power supply 202 to pump the bit line voltage above $V_{cc}$ during programming.

To prevent such read errors and current leakage during programming, a minimum threshold limit is placed on all cells, such as the 0.5 V limit discussed above. To provide a minimum threshold voltage limit for erased cells, a threshold convergence method must be applied. Several different convergence methods are employed by manufacturers.

One convergence method is described in a paper entitled "A Self-Convergence Erasing Scheme For A Simple Stacked Gate Flash EEPROM," by S. Yamada et al. (Yamada), IEEE *Tech. Dig.* IEDM 1991, pp 307–310. As disclosed in Yamada, self-convergence is performed by applying a source voltage of approximately 6 volts to erased memory cells while grounding gates and drains of the cells. The self-convergence results achieved in Yamada may also be achieved by applying the same voltage applied to the sources to the drains (henceforth referred to as drain disturb voltage) while grounding the sources.

To illustrate self-convergence, FIG. 3 plots the threshold voltages (Vt) for a flash memory cell as a function of drain disturb voltage application time with a different starting threshold voltage for each application. The x-axis represents the drain disturb time in milliseconds and the y-axis represents the threshold voltage of the memory cells. As shown in FIG. 3, threshold voltages that are above approximately 2 V, the threshold obtained when erased by ultraviolet (UV)

light, remain unaffected by the drain disturb voltage. The effects of the drain disturb voltage cause the threshold voltages erased below the UV-erased threshold to converge to a steady-state threshold voltage 300 of approximately 0 V.

One problem associated with self-convergence as described in Yamada is that both avalanche-hot electron injection and avalanche-hot hole injection are utilized to converge the threshold voltages to a steady-state. Avalanche-hot hole injection to the gate is known to cause device degradation. Device degradation affects the longevity and reliability of the device.

FIG. 4 illustrates hot hole injection as compared to hot electron injection by showing an erase threshold distribution 400 along with a plot 402 showing convergence of threshold voltages to a steady-state. Region 410 represents memory cells with threshold voltages above the UV-erase threshold which do not converge when a drain disturb voltage is applied as shown by line 420. Region 412 represents memory cells that are injected with holes to the floating gate when the drain disturb voltage is applied to reduce their threshold to the steady-state threshold voltage 422. Region 414 represents memory cells that are injected with electrons to increase their threshold voltage to a steady-state threshold voltage 422.

Another problem associated with self-convergence as described by Yamada is that after convergence, a wide threshold distribution exists between converged thresholds and thresholds which do not converge, but remain above the UV-erase threshold.

A method of convergence which improves upon the self-convergence method of Yamada is disclosed in U.S. patent application Ser. No. 08/160,057 entitled "An Adjustable Threshold Voltage Conversion Circuit", by J. Chen, et al. (Chen), filed Dec. 1, 1993. The convergence method of Chen reduces hot hole injection to prevent device degradation and tightens the threshold distribution after convergence.

In the convergence method of Chen, a drain disturb voltage is applied while grounding the sources, similar to Yamada. However, instead of grounding gates as in Yamada, Chen applies a more positive gate voltage to cause the threshold voltages to converge at a higher, more positive value.

FIG. 5 illustrates the effects of application of a more positive gate voltage during self-convergence by plotting threshold voltages as a function of drain disturb time as well as a function of different gate voltages. Three sets of data are represented in FIG. 5. A drain disturbed voltage Vd of 6.5 volts is applied to each of the three data sets. Data trace 502 is derived by applying 0 volts at the gate of the memory cells as in Yamada. Data trace 504 is derived by applying a gate voltage of 0.5 volts, and data trace 506 is derived by applying 1.0 volts at the gate. The data shows that there is essentially a direct relationship between the gate voltage $V_G$ and the steady state threshold voltage of cells which are converged.

FIG. 6 illustrates the effect of applying a gate voltage during self-convergence on hot hole injection by showing an erase threshold distribution 600 along with a plot 602 showing convergence of threshold voltages to a steady-state, similar to FIG. 4. A dashed line 622 shows the location of a steady-state threshold obtained by application of a gate voltage of 0 V to the threshold distribution 600. Line 620 shows the location of a steady-state threshold where a gate voltage of 1.0 V is applied during application of the drain disturb voltage. Region 614 of erase distribution 600 represents the region where electrons are injected into the floating gate to increase the threshold voltage to the steady-state threshold voltage. Region 612 of erase distribution 600 represents where holes are injected into the floating gate to decrease the threshold voltage to the steady-state threshold voltage. The number of electrons injected into the gate, region 614, is much larger than the number of holes injected into the gate, region 612. Comparing regions 612 and 614 of FIG. 6 with regions 412 and 414 of FIG. 4 indicates that the application of a more positive gate voltage $V_G$ during self-convergence, has substantially increased electron injection and has substantially reduced hole injection.

As shown in FIG. by line 620 as opposed to line 622, by applying a more positive gate voltage during self-convergence, the steady-state threshold voltage can be moved closer to the threshold of cells with thresholds above the UV-erase threshold to provide a tighter after erase threshold voltage distribution.

A problem with the convergence method of Yamada as well as Chen is that significant power is required for convergence. After erase, a significant number of overerased cells have a threshold voltage less than zero volts. When the drain disturb voltage is applied, with a gate voltage of zero volts the overerased cells will conduct. With cells conducting, additional current is necessary to maintain the drain disturb voltage. By increasing the gate voltage as disclosed in Chen, even more cells will conduct, thus further increasing the current required for the drain disturb voltage.

Chen suggested that if power is a concern, the power required could be reduced by performing convergence on a byte-by-byte basis rather than erasing larger portions of the array cells at one time. However, adding circuitry for selecting particular cells for byte-by-byte convergence is undesirable because of added complexity as well as additional space required for the circuitry. Further, the additional time required for converging only portions of the memory at a time as opposed to erasing the entire memory at once is undesirable.

Increasing the power supply is further undesirable. For providing a flash memory as a low power device, such as 3 V devices currently utilized with battery powered notebook computers, a charge pump may be required in a power supply, such as 202, to pump the voltage above 3 V during program and eirase. Requiring the charge pump size to be increased to overcome leakage current during convergence is undesirable.

SUMMARY OF THE INVENTION

The present invention utilizes threshold self-convergence to converge thresholds of erased cells to a greater, more positive value similar to Yamada and Chen.

The present invention further reduces hot hole injection and achieves a tighter threshold distribution than Yamada, similar to Chen.

The present invention further reduces the total current required for threshold convergence in comparison to both Yamada and Chen so that all overerased bits on a bit line can be corrected in parallel rather than on a byte-by-byte basis as suggested in Chen.

By reducing total current required, the present invention further eliminates the need to increase charge pump size to enable convergence in low power devices, such as a 3 V device.

The present invention is a method for converging the threshold voltage distribution of memory cells after erase. In the method of the present invention, a drain disturb voltage is applied to one or more bit lines of a memory array, similar to Yamada and Chen. However, instead of applying a single gate voltage of 0 V as in Yamada or a more positive value as in Chen, the present invention starts the overerase correction with a negative gate voltage $V_G$ and then increases the gate voltage $V_G$ in steps until a desired minimum threshold value is reached. Each gate voltage step is applied for only a short time period to prevent hot hole injection.

By utilizing self-convergence, as in Yamada and Chen, the present invention enables convergence of thresholds of erased cells to a greater, more positive value. Further, by utilizing a gate voltage applied during self-convergence which becomes greater than zero, the present invention further achieves a tighter threshold distribution than Yamada, similar to Chen.

By applying a gate voltage with an initial negative value, even overerased cells which have a higher threshold than the gate voltage will not conduct, reducing leakage current during convergence in comparison to both Yamada and Chen. By reducing leakage current during convergence, the present invention enables overerased bits to be corrected in parallel when the power supply is limited rather than on a byte-by-byte basis as in Chen, reducing overall convergence time in comparison to Chen. By reducing leakage current, the present invention is useful in low power devices, such as 3 V devices, where charge pumps are required to increase voltage above Vcc because smaller size charge pumps may be utilized.

BRIEF DESCRIPTION OF THE DRAWINGS

Further details of the present invention are explained with the help of the attached drawings in which.

DETAILED DESCRIPTION

Figure 1:
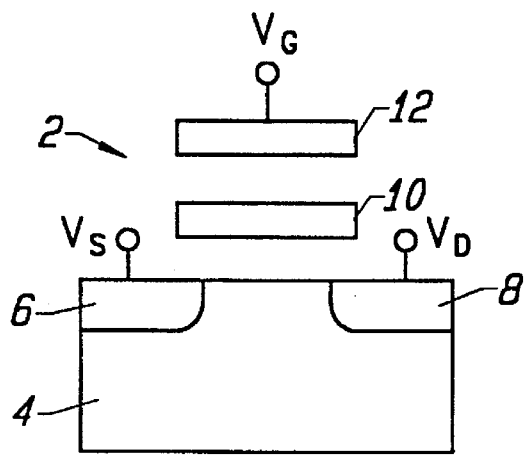
FIG. 1 shows a cross section of a typical flash EEPROM array cell 2.
Figure 2:
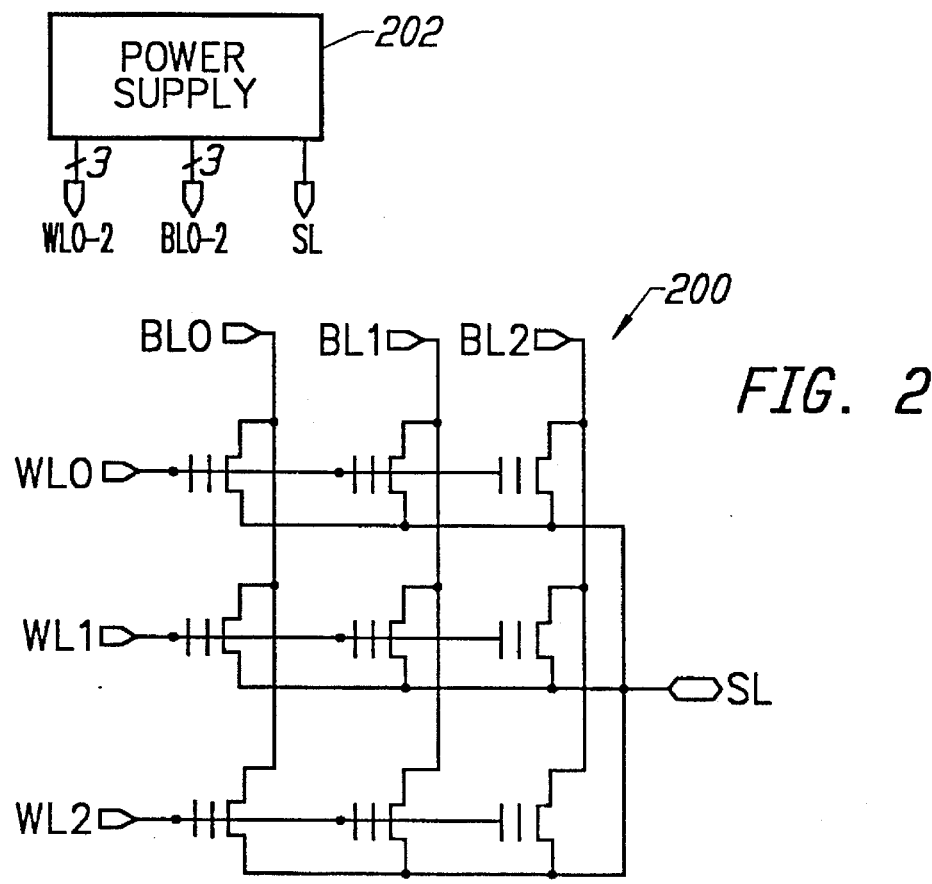
FIG. 2 illustrates how memory cells of FIG. 1 are configured in an array.
Figure 3:
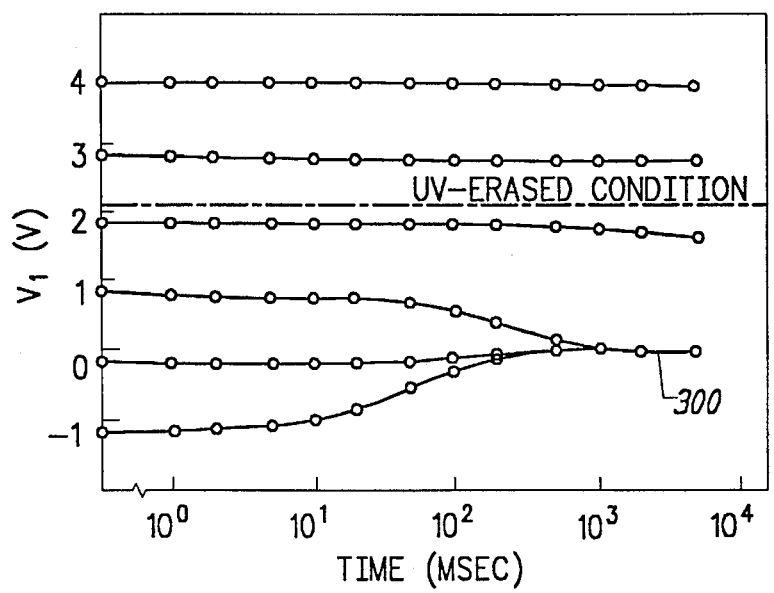
FIG. 3 plots threshold voltages for a flash memory cell as a function of drain disturb voltage application time.
Figure 4:
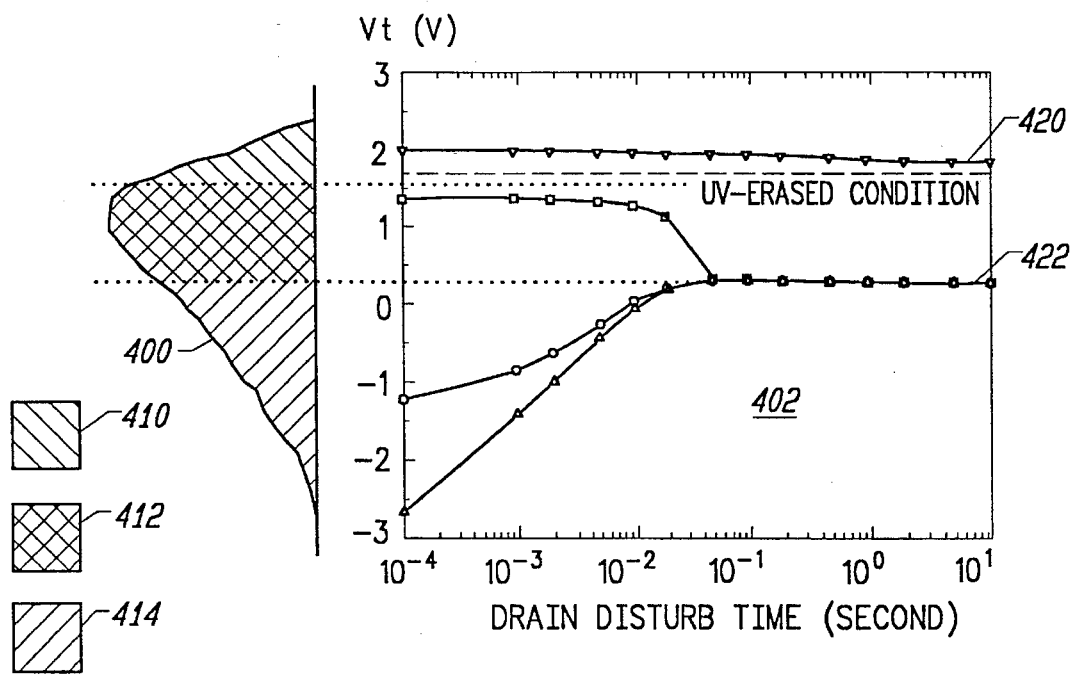
FIG. 4 shows an erase threshold distribution along with a plot showing convergence of threshold voltages to a steady-state to illustrate hot hole injection as compared to hot electron injection.

The present invention is a method for converging the threshold voltage distribution of memory cells after erase. The convergence method is applicable to memory structures including the flash EEPROM cell shown in FIG. 1 as well as cells configured in an array shown in FIG. 2. The convergence method of the present invention is applied to raise the threshold voltage of overerased cells which may be created by continuous applications of an erase pulse as described previously.

In the convergence method of the present invention, a drain disturb voltage $V_D$ is applied to one or more bit lines of a memory array, similar to Yamada and Chen. However, instead of applying a single gate voltage of 0V as in Yamada or a single more positive value as in Chen, the present invention starts the overerase correction with a negative gate voltage $V_G$ and then increases the gate voltage $V_G$ in steps until a desired minimum threshold value is reached.

By utilizing self-convergence, as in Yamada and Chen, the present invention enables convergence of thresholds of erased cells to a greater, more positive value similar to Yamada and Chen. Further, by utilizing a gate voltage applied during self-convergence which becomes greater than zero, the present invention achieves a tighter threshold distribution than Yamada, similar to Chen.

One concern in applying a negative gate voltage, as identified in Chen, is that increased hot hole injection will occur causing device degradation. The present invention, however, prevents such hot hole injection by applying each gate voltage pulse for only a short time period of time, such as 100 ms.

Figure 5:
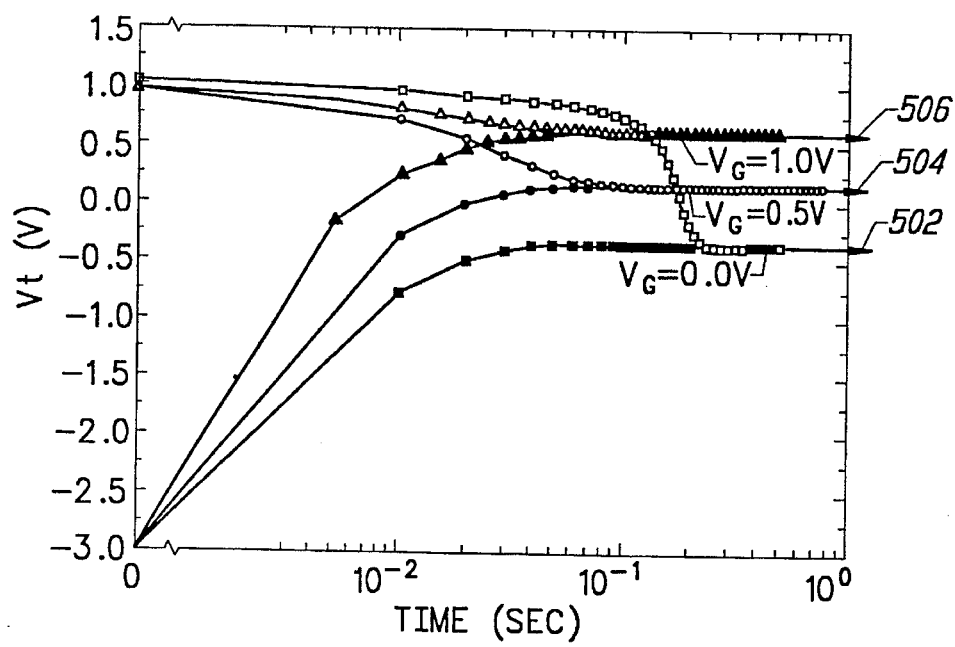
FIG. 5 plots threshold voltages as a function of drain disturb time as well as a function of different gate voltages to illustrate the effects of applying different gate voltages during self-convergence.
Figure 6:
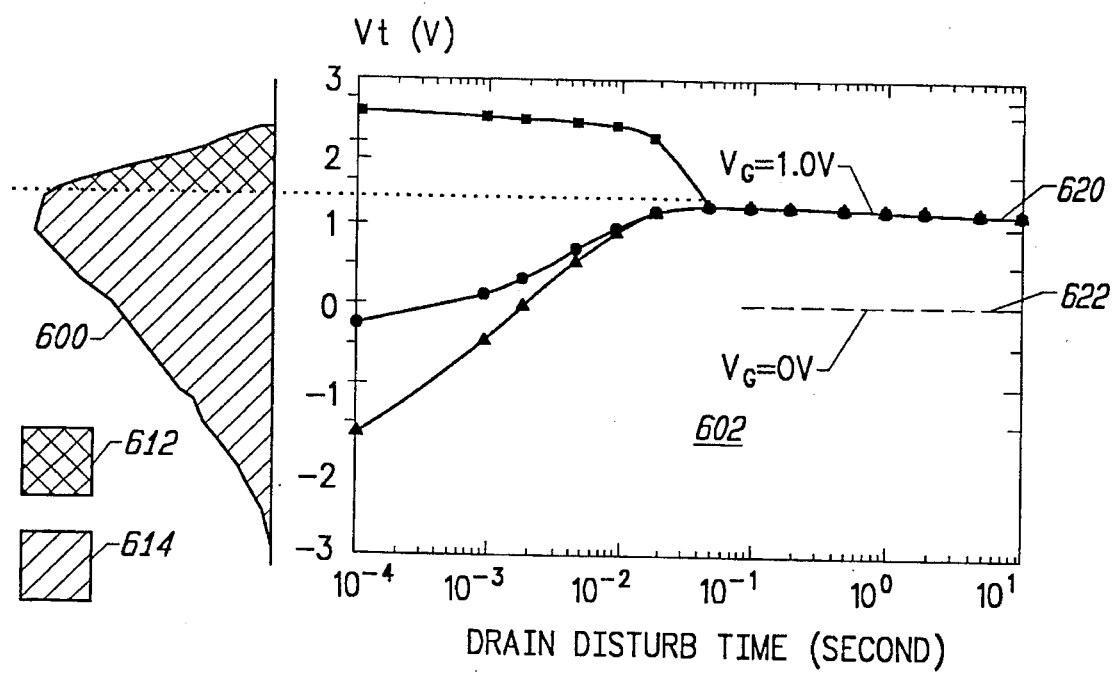
FIG. 6 shows an erase threshold distribution along with a plot showing convergence of threshold voltages to a steady-state to illustrate the effect of applying a gate voltage on hot hole injection.
Figure 7:
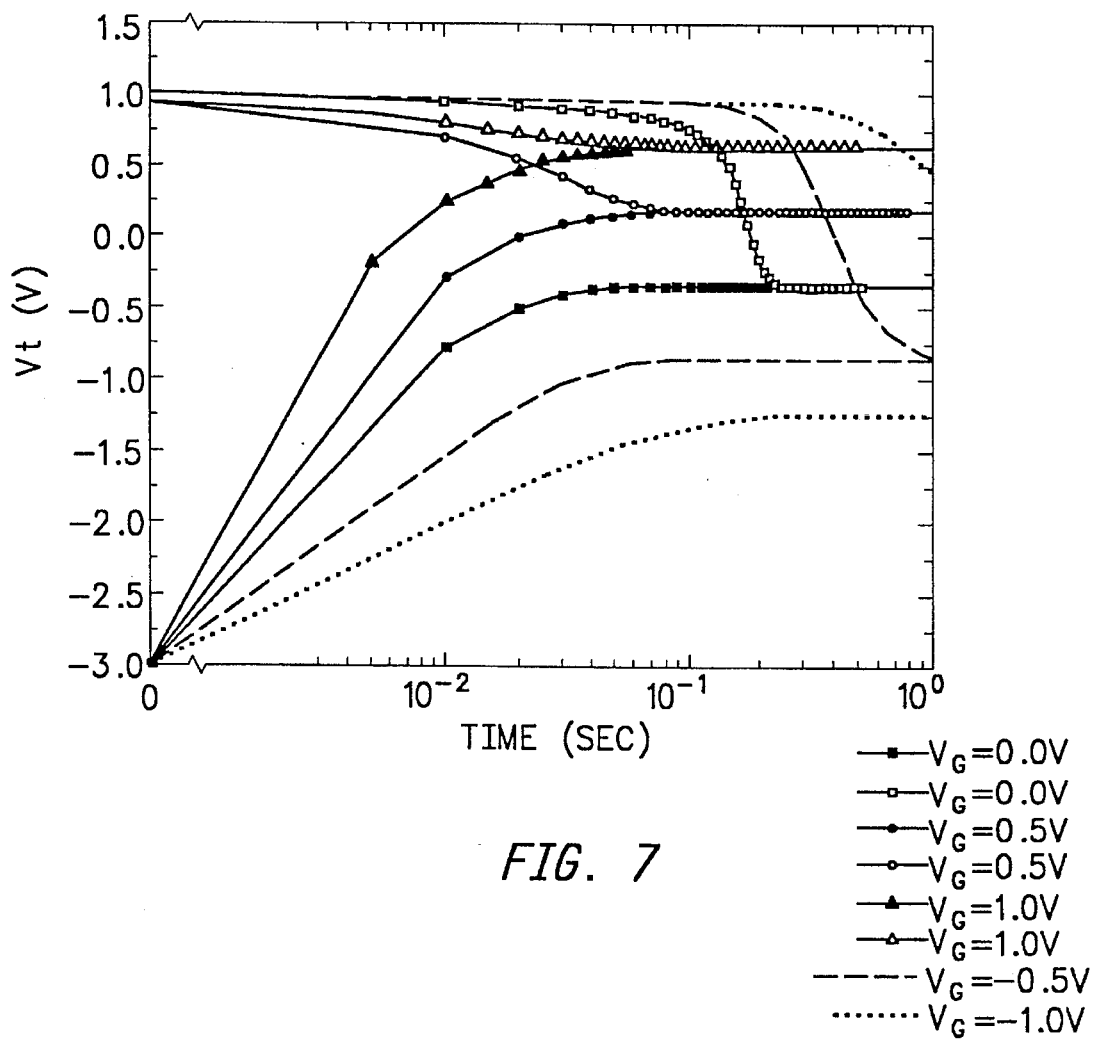
FIG. 7 plots the threshold voltages for a flash memory cell as a function of drain disturb voltage time as well as a function of different gate voltages, similar to FIG. 5, to show that application of short gate pulses in the present invention minimizes hot hole injection.

FIG. 7 illustrates that by application of short stepped gate pulses, cells which require hot electron injection to converge will converge to a steady state threshold, but cells which require hot hole injection to converge will not converge to a steady state threshold. FIG. 7 plots the threshold voltages for a memory cell as a function of drain disturb voltage time as well as a function of different gate voltages, similar to FIG. 5, but with additional gate voltages applied which are negative. As shown in FIG. 7, with $V_G=-1.0$ V, a cell with a threshold starting at Vt=-3.0 V is expected to reach Vt=-2.0 V in 10 ms and a threshold of Vt=-1.5 V in 100 ms. However, with $V_G=-1.0$ V, cells starting at Vt=1.0 V which require hot hole injection take longer than one second to reach Vt=-1.5 V.

Figure 8:
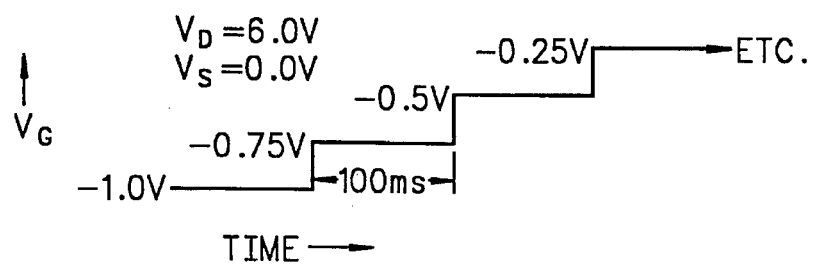
FIG. 8 shows an example of a gate voltage applied to all bit lines of an array of memory cells for the convergence method of the present invention.

FIG. 8 shows an example of a gate voltage applied to all bit lines of an array of memory cells for the convergence method of the present invention. In the example, during application of a drain disturb voltage of 6.0 V with sources grounded, a stepped gate voltage $V_G$ is applied. With an initial gate voltage $V_G=-1.0$ V., the gate voltage of all cells, having characteristics shown in FIG. 7, will have thresholds at Vt≥-1.5 V after 100 ms. The gate voltage $V_G$ is then reduced to -0.75 V, to again shift cells with the most negatively erased thresholds to Vt≥-1.0 in 100 ms. The procedure is repeated with gradually increasing $V_G$ levels to gradually shift the threshold of the cells on the bit lines to a predetermined value.

FIG. 8 is just one example of a series of gate voltages which may be applied. As described in Chen and illustrated in a paper entitled "Study of Over Erase Correction Convergence Point Vth*" by J. Chen et al AMD Tech. Conf. 1994, p. 68, the steady-state threshold to which cells converge, Vth*, is a function of the gate voltage $V_G$ and drain disturb voltage $V_D$ applied among other factors including the hot electron generation efficiency of each flash EEPROM cell. The hot electron generation efficiency is a function of electric field in the channel where the hot electron injection into the floating gate occurs which varies for individual devices. Therefore, the range of gate voltages, as well as the source and drain voltages to be applied for the convergence method of the present invention will depend on the initial threshold distribution in the array, electrical characteristics of the cells, and the desired convergence threshold Vth*. A power supply such as 202 of FIG. 2 can be controlled to apply gate, drain and source voltages according to individual parameters of a device to provide convergence according to the present invention.

By initially applying a negative gate voltage during self-convergence, the present invention enables a significant reduction in leakage current. With a negative gate voltages, even overerased cells will not conduct if their thresholds are above the negative gate voltage. With fewer overerased cells conducting, less current is required for convergence than with application of a gate voltage of zero volts as in Yamada, or a more positive gate voltage as in Chen.

By reducing current required during convergence, the present invention enables overerased bits on a bit line to be corrected in parallel when the power supply is limited rather than on a byte-by-byte basis as in Chen.

By utilizing less current, the present invention is of particular benefit if the bit line voltage needs to be pumped by a charge pump to above the chips Vcc during threshold convergence as may be required in low power devices, such as a 3 V device. Because less current is utilized, the size oil the charge pump circuitry and hence the total chip die size can be reduced.

Although the invention has been described above with particularity, this was merely to teach one of ordinary skill in the art how to make and use the invention. Many modifications will fall within the scope of the invention, as that scope is defined by the claims which follow.

What is claimed is:

1. A method of converging threshold voltages of memory cells in a flash memory array after the memory cells have been erased, the method comprising successive steps of:

setting a gate voltage to an initial value;

applying a drain voltage greater than the gate voltage to drains of the memory cells for a time period while applying the gate voltage to gates of the memory cells; and increasing the gate voltage in a positive direction and repeating the previous step if the gate voltage is below a predetermined value above the initial value.

2. The method of claim 1 wherein the initial value of the gate voltage is a negative value.

3. The method of claim 1 wherein the time period during which the drain voltage is applied is long enough for cells to converge to a steady-state threshold voltage by hot-electron injection, but short enough to prevent cells from converging to the steady-state threshold voltage by hot-hole injection.

4. The method of claim 1 wherein the time period during which the drain voltage is applied is short enough to substantially prevent hot hole injection.

5. The method of claim 1 wherein the time period during which the drain voltage is applied is substantially 100 ms.

6. The method of claim 1 wherein when the gate voltage reaches the predetermined value, the threshold voltages of the memory cells are above zero volts.

7. A flash memory array having a power supply controlled to apply the gate and drain voltages for converging threshold voltages of memory cells according to the method of claim 1.

8. A method of converging threshold voltages of memory cells in a flash memory array after the memory cells have been erased, the method comprising successive steps of:

applying a drain voltage to drains of the memory cells while applying a first gate voltage for a time period long enough to allow some memory cells to converge to a steady-state voltage, but short enough to prevent all cells which would converge to the steady-state voltage from converging; and applying the drain voltage to drains of the memory cells while applying a second gate voltage having a more positive value than the first gate voltage for a time period long enough to allow all memory cells which will converge to a steady-state voltage to converge.

9. The method of claim 8 wherein a power supply utilizes a charge pump to provide the drain voltage and the charge pump has a size required to supply the drain voltage which is less than a size required for a charge pump utilized to converge thresholds by applying the second step of claim 8 without applying the first step.

10. The method of claim 8 wherein current required to supply the drain voltage is less than current required to converge thresholds by applying the second step of claim 8 without applying the first step.

11. A method of converging threshold voltages of memory cells in a flash memory array after the memory cells have been erased, the method comprising successive steps of:

applying a drain voltage to drains of the memory cells while applying a plurality of gate voltage pulses, each gate voltage pulse after a first gate voltage pulse having a more positive value than a previous gate voltage pulse, each gage voltage pulse being applied for a time period long enough for cells to converge to a steady-state threshold voltage by hot-electron injection, but short enough to prevent cells from converging to the steady-state threshold voltage by hot-hole injection.

12. The method of claim 11 wherein the first gate voltage pulse applied has a negative value.

13. The method of claim 11 wherein after a last one of the plurality of gate voltage pulses is applied, the threshold voltages of the memory cells are above zero volts.

14. The method of claim 1, wherein the drain voltage is a drain disturb voltage.

15. The method of claim 8, wherein the drain voltage is a drain disturb voltage, and the first gate voltage and the second gate voltage are applied at voltage values below the drain voltage.

16. The method of claim 11, wherein the drain voltage is a drain disturb voltage, and each of the plurality of gate voltages is applied at a value below the drain voltage.

* * * * *